(12) United States Patent
Matsubara et al.

(10) Patent No.: US 10,608,626 B2
(45) Date of Patent: Mar. 31, 2020

(54) DRIVING APPARATUS AND SEMICONDUCTOR DEVICE

(71) Applicant: FUJI ELECTRIC CO., LTD., Kanagawa (JP)

(72) Inventors: Kunio Matsubara, Hino (JP); Tsuyoshi Nagano, Hino (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 0 days.

(21) Appl. No.: 16/167,562

(22) Filed: Oct. 23, 2018

(65) Prior Publication Data

US 2019/0190511 A1 Jun. 20, 2019

(30) Foreign Application Priority Data

Dec. 19, 2017 (JP) .................................. 2017-243058

(51) Int. Cl.
*H03K 3/00* (2006.01)
*H03K 17/082* (2006.01)
*H03K 17/732* (2006.01)
*H03K 17/284* (2006.01)
*H03K 17/0812* (2006.01)
*H03K 17/16* (2006.01)

(52) U.S. Cl.
CPC ... *H03K 17/0822* (2013.01); *H03K 17/08122* (2013.01); *H03K 17/163* (2013.01); *H03K 17/166* (2013.01); *H03K 17/284* (2013.01); *H03K 17/732* (2013.01)

(58) Field of Classification Search
CPC ......... H02M 2001/0009; H02M 3/157; H02M 3/07; H02M 3/33515
See application file for complete search history.

(56) References Cited

U.S. PATENT DOCUMENTS

| 2007/0115038 | A1 | 5/2007 | Higashi |
| 2014/0160601 | A1* | 6/2014 | Ouyang ................ H02M 3/158 361/18 |
| 2014/0253184 | A1 | 9/2014 | Yamauchi |
| 2015/0282290 | A1* | 10/2015 | Borowy .................. H05H 1/34 219/121.39 |
| 2017/0093392 | A1 | 3/2017 | Kobayashi |

FOREIGN PATENT DOCUMENTS

| JP | 2008078816 A | 4/2008 |
| JP | 2008193717 A | 8/2008 |
| JP | 2009195017 A | 8/2009 |
| JP | 4742828 B2 | 8/2011 |
| JP | 5516705 B2 | 6/2014 |
| JP | 2014176228 A | 9/2014 |
| JP | 2015204659 A | 11/2015 |
| JP | 2016077110 A | 5/2016 |
| JP | 6168253 B1 | 7/2017 |

* cited by examiner

*Primary Examiner* — Sibin Chen

(57) ABSTRACT

A driving apparatus is provided, the driving apparatus including: a gate driving unit that drives a semiconductor element; a sampling unit that samples, in an on-period of the semiconductor element, an observation value that changes according to an on-current flowing through the semiconductor element; and a changing unit that changes a driving condition under which the gate driving unit drives a gate of the semiconductor element when the semiconductor element is turned off according to the observation value sampled in an on-period of the semiconductor element.

11 Claims, 6 Drawing Sheets

DRIVING APPARATUS AND SEMICONDUCTOR DEVICE

The contents of the following Japanese patent application are incorporated herein by reference:
NO. 2017-243058 filed in JP on Dec. 19, 2017.

BACKGROUND

1. Technical Field

The present invention relates to a driving apparatus and a semiconductor device.

2. Related Art

Conventionally, various techniques for turning off a semiconductor element while at the same time reducing turn-off loss, surge voltage or the like have been proposed for a driving apparatus that drives the gate of the semiconductor element (please see Patent Documents 1 to 9, for example). Such techniques change driving conditions for example when voltage of a semiconductor element to be turned off reached a power-supply voltage.

Patent Document 1: Japanese Patent No. 5516705
Patent Document 2: Japanese Patent Application Publication No. 2015-204659
Patent Document 3: Japanese Patent No. 4742828
Patent Document 4: Japanese Patent No. 6168253
Patent Document 5: Japanese Patent Application Publication No. 2008-78816
Patent Document 6: Japanese Patent Application Publication No. 2009-195017
Patent Document 7: Japanese Patent Application Publication No. 2008-193717
Patent Document 8: Japanese Patent Application Publication No. 2014-176228
Patent Document 9: Japanese Patent Application Publication No. 2016-77110

However, with increase in the switching speed of a semiconductor element, it has been becoming difficult to change driving conditions by detecting an abnormality based on measured values of voltage or the like from the start to the end of turn-off.

SUMMARY

In order to solve the above-mentioned drawbacks, a first aspect of the present invention may provide a driving apparatus. The driving apparatus may include a gate driving unit that drives a semiconductor element. The driving apparatus may include a sampling unit that samples, in an on-period of the semiconductor element, an observation value that changes according to an on-current flowing through the semiconductor element. The driving apparatus may include a changing unit that changes a driving condition under which the gate driving unit drives a gate of the semiconductor element when the semiconductor element is turned off according to the observation value sampled in an on-period of the semiconductor element.

The sampling unit may hold the sampled observation value. The changing unit may change a driving condition under which the gate driving unit drives the gate when the semiconductor element is turned off according to the held observation value.

The sampling unit may sample the observation value in a turn-on period of the semiconductor element.

The sampling unit may sample the observation value corresponding to a length of time starting at a start of a turn-on period of the semiconductor element and terminating when an element voltage of the semiconductor element becomes a reference voltage.

The sampling unit may have a comparator circuit that compares an element voltage of the semiconductor element with a reference voltage The sampling unit may have a sampling circuit that samples the observation value corresponding to a result of comparison by the comparator circuit at timing at which first reference time has elapsed after a start of a turn-on period of the semiconductor element.

The sampling unit may sample the observation value corresponding to a gate voltage or gate current of the semiconductor element at timing at which second reference time has elapsed after a turn-on period of the semiconductor element has started.

The sampling unit may sample the observation value corresponding to a gate voltage or gate current of the semiconductor element in a mirror period in a turn-on period of the semiconductor element.

The changing unit may be able to switch to a first driving condition and a second driving condition under which a charge amount of a gate of the semiconductor element is changed gradually as compared to the first driving condition. If the observation value sampled in an on-period of the semiconductor element indicates an on-current equal to or lower than a reference current, the changing unit may maintain a driving condition for the gate driving unit at the first driving condition in a turn-off period of the semiconductor element. If the observation value sampled in an on-period of the semiconductor element indicates an on-current exceeding a reference current, the changing unit may switch a driving condition for the gate driving unit from the first driving condition to the second driving condition during a turn-off period of the semiconductor element.

The reference current may be a value obtained by subtracting a predetermined margin from an overcurrent level at which a surge voltage that occurs accompanying turn-off of the semiconductor element becomes an overvoltage.

The driving apparatus may further include a timeout detecting unit that detects whether or not an on-period of the semiconductor element has exceeded predetermined third reference time. If an on-period of the semiconductor element has exceeded the third reference time, the changing unit may switch a driving condition for the gate driving unit from the first driving condition to the second driving condition during a turn-off period of the semiconductor element irrespective of a magnitude of the observation value.

The semiconductor element may be a wide-bandgap semiconductor element.

A second aspect of the present invention may provide a semiconductor device. The semiconductor device may include the driving apparatus according to the first aspect of the present invention. The semiconductor device may include the semiconductor element.

The summary clause does not necessarily describe all necessary features of the embodiments of the present invention. The present invention may also be a sub-combination of the features described above.

DESCRIPTION OF EXEMPLARY EMBODIMENTS

Hereinafter, (some) embodiment(s) of the present invention will be described. The embodiment(s) do(es) not limit the invention according to the claims, and all the combinations of the features described in the embodiment(s) are not necessarily essential to means provided by aspects of the invention.

Figure 1:
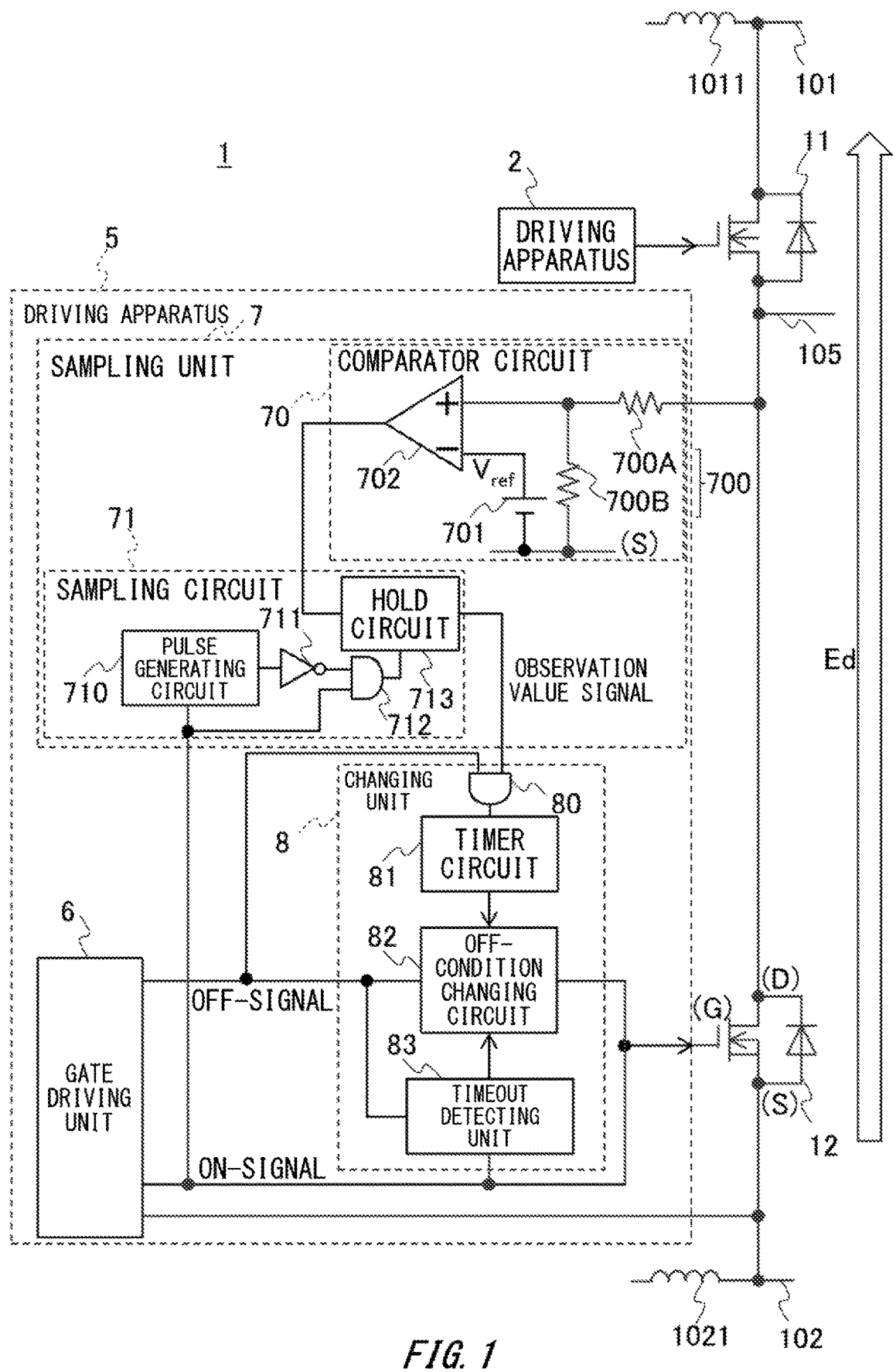
FIG. 1 shows a semiconductor device according to an embodiment.

FIG. 1 shows a semiconductor device 1 according to the present embodiment. In the figure, the outline arrow indicates voltage.

The semiconductor device 1 corresponds to one phase of a power converting device used for driving a motor or supplying power, as one example, and outputs voltage, from a power-supply output terminal 105, converted by switching connection between a positive side power line 101 and a negative-side power line 102, and the power-supply output terminal 105.

Here, a DC voltage Ed of 600 to 800V, for example, is applied between the positive side power line 101 and the negative-side power line 102. In addition, wiring inductances 1011, 1021 corresponding to the wire lengths of the positive side power line 101 and negative-side power line 102, respectively, may exist in them.

The semiconductor device 1 includes: a semiconductor element 11 and a semiconductor element 12; a driving apparatus 2 associated with the semiconductor element 11 on the positive side; and a driving apparatus 5 associated with the semiconductor element 12 on the negative side. Because the configuration of the driving apparatus 2 on the positive side is the same as the driving apparatus 5 on the negative side, an explanation thereof is omitted.

The semiconductor element 11 and semiconductor element 12 are sequentially connected in series between the negative-side power line 102 and the positive side power line 101. The power-supply output terminal 105 may be connected at the middle point between the semiconductor element 11 and the semiconductor element 12.

The semiconductor element 11 and semiconductor element 12 are switch elements which are switchingly turned on and off by the driving apparatus 2 and the driving apparatus 5, respectively. As one example, the semiconductor element 11 and semiconductor element 12 constitute the upper arm and lower arm of the power converting device.

At least one of the semiconductor element 11 and the semiconductor element 12 may be a wide-bandgap semiconductor element. The wide-bandgap semiconductor element refers to a semiconductor element having a bandgap larger than that of a silicon semiconductor element, and for example is a semiconductor element containing SiC, GaN, diamond, a gallium nitride-based material, a gallium oxide-based material, AlN, AlGaN, ZnO or the like. The wide-bandgap semiconductor element can improve a switching speed more than a silicon semiconductor element can.

In addition, in the present example, the semiconductor element 11 and semiconductor element 12 are MOSFETs, and have parasitic diodes whose positive side power line 101 sides are cathodes. (illustrated in FIG. 1). Semiconductor elements with other structures such as IGBTs or bipolar transistors can be applied to the semiconductor element 11 and semiconductor element 12, and a diode, a Schottky barrier diode or the like is connected in anti-parallel with each of the semiconductor elements as necessary.

The driving apparatus 5 drives the semiconductor element 12 based on an input signal. For example, the driving apparatus 5 cooperates with the driving apparatus 2, and when turning on the semiconductor element 11 and the semiconductor element 12 alternately, turns off one of the elements, and thereafter turns on the other element. The driving apparatus 5 reduces turn-off loss and additionally suppresses the surge voltage by switching the variable speed of gate charge of the semiconductor element 12 in a turn-off period (in the present embodiment, a period from the start to the completion of execution of turn-off, as one example), that is, by switching the variable speed of gate voltage (Vgs) which is a gate-source voltage of the semiconductor element 12.

The driving apparatus 5 includes a gate driving unit 6, a sampling unit 7 and a changing unit 8. The gate driving unit 6 drives the semiconductor element 12. For example, the gate driving unit 6 supplies the gate of the semiconductor element 12 with a turn-on signal to turn on the semiconductor element 12. In addition, the gate driving unit 6 supplies, through the changing unit 8, the gate of the semiconductor element 12 with a turn-off signal to turn off the semiconductor element 12.

The sampling unit 7 samples, in an on-period of the semiconductor element 12, an observation value that changes according to an on-current flowing through the semiconductor element 12. For example, the sampling unit 7 samples an observation value in a turn-on period of the semiconductor element 12.

Here, the sampled observation value indicates an on-current of the semiconductor element 12, and is used for predicting whether or not an overcurrent due to the surge voltage occurs in a turn-off period. This is because if an operation waveform in a turn-on period, an on-current and an operation waveform in a turn-off period thereafter are examined preliminarily, it is possible to predict whether an on-current of the semiconductor element 12 is large or small, and eventually whether or not an overcurrent occurs in a turn-off period based on whether a length of time until an observation value becomes a reference value in a turn-on period is long or short or whether an observation value at the time point when a reference length of time has elapsed is large or small. In addition, this is because it is possible to predict whether or not an overcurrent occurs in a turn-off period based on a current at the time of turn-on because particularly if PWM-control is being performed, currents almost match at the time of turn-on and turn-off.

The sampling unit 7 supplies the changing unit 8 with the sampled observation value. The sampling unit 7 has a comparator circuit 70 and a sampling circuit 71.

The comparator circuit 70 compares an element voltage of the semiconductor element 12, a drain-source voltage as one example, in the present embodiment, with a reference voltage Vref. The reference voltage Vref of the element voltage may correspond to a reference current of on-current of the semiconductor element 12. This reference current may be a value at an overcurrent level at which the surge voltage that occurs accompanying turn-off of the semiconductor element 12 becomes an overvoltage, but in the present embodiment, is a value obtained by subtracting a predetermined margin from the value at the overcurrent level. As one example, when the overcurrent level at which the surge voltage becomes an overvoltage is 400 A, the reference current may be 300 A.

The comparator circuit 70 supplies the sampling circuit 71 with a result of the comparison. As one example, in the present embodiment, the comparator circuit 70 has a resistance type potential divider 700, a reference voltage source 701 and a comparator 702.

The resistance type potential divider 700 divides an element voltage of the semiconductor element 12. The resistance type potential divider 700 may have a resistance 700A provided between the drain terminal of the semiconductor element 12 and the comparator 702, and a resistance 700B provided between a portion between the resistance 700A and the comparator 702, and the source terminal of the semiconductor element 12.

The reference voltage source 701 supplies the comparator 702 with the reference voltage $V_{ref}$. As one example, in the present embodiment, the reference voltage source 701 is connected between the comparator 702 and the source terminal of the semiconductor element 12.

The comparator 702 compares an element voltage obtained by dividing an element voltage of the semiconductor element 12 at the resistance type potential divider 700 with the reference voltage Vref. As one example, in the present embodiment, the comparator 702 supplies the sampling circuit 71 with a signal that becomes "1" if the element voltage is equal to or higher than the reference voltage Vref and becomes "0" if the element voltage is lower than the reference voltage Vref.

At the timing at which first reference time has elapsed after the start of a turn-on period of the semiconductor element 12, the sampling circuit 71 samples an observation value corresponding to a result of comparison by the comparator circuit 70. Thereby, an observation value corresponding to a length of time starting at the start of a turn-on period of the semiconductor element 12 and terminating when the element voltage of the semiconductor element 12 becomes the reference voltage Vref is sampled. Although as one example, in the present embodiment, the sampling circuit 71 samples, as an observation value, a value output by the comparator circuit 70, it may sample a value that changes according to a value output by the comparator circuit 70.

Here, the turn-on period start timing may be the timing at which an on-signal is supplied to the gate of the semiconductor element 12, or may be the timing at which a gate voltage or gate current starts varying. The first reference time end timing, that is, the sampling timing, may be the timing at which an observation value that enables prediction as to whether or not an overcurrent will be generated during a turn-off period is acquired, and may be before the semiconductor element 12 enters a steady on-state. The length of the first reference time is adjusted such that the surge voltage does not reach an overvoltage level. For example, a length of time starting at the turn-on period start timing and terminating when an output of the comparator 702 becomes "1" when the smallest on-current that makes the surge voltage at the time of turn-off becomes an overvoltage may be preliminarily measured and used as the length of the first reference time.

The sampling circuit 71 supplies the changing unit 8 with the sampled observation value. As one example, in the present embodiment, the sampling circuit 71 has a pulse generating circuit 710, a logical NOT circuit 711, a logical AND circuit 712 and a hold circuit 713.

The pulse generating circuit 710 supplies the logical NOT circuit 711 with a pulse signal having the length of the first reference time. As one example, the pulse generating circuit 710 supplies the logical NOT circuit 711 with a signal that becomes "1" for the first reference time according to an on-signal being output from the gate driving unit 6, and becomes "0" before and after the first reference time.

The logical NOT circuit 711 performs a NOT operation on a pulse signal from the pulse generating circuit 710, and supplies the logical AND circuit 712 with a result of the operation. Thereby, the logical NOT circuit 711 supplies the logical AND circuit 712 with a signal that becomes "0" for the first reference time according to an on-signal being output from the gate driving unit 6 and becomes "1" before and after the first reference time.

The logical AND circuit 712 performs a logical AND operation on the signal supplied from the logical NOT circuit 711 and the on-signal supplied from the gate driving unit 6 to the gate of the semiconductor element 12. Thereby, the logical AND circuit 712 outputs a signal that becomes "1" at the timing at which the first reference time has elapsed after the start of a turn-on period in a period during which the on-signal is supplied to the semiconductor element 12. The logical AND circuit 712 supplies the trigger terminal of the hold circuit 713 with a signal indicating a result of the operation.

The hold circuit 713 holds an observation value. The hold circuit 713 samples an observation value at rising timing at which a result of the operation of logical AND by the logical AND circuit 712 becomes "1". Thereby, an observation value indicating whether or not an element voltage is lower than the reference voltage Vref at the timing at which the first reference time has elapsed after the start of a turn-on period in a period during which the on-signal is supplied to the semiconductor element 12 is sampled. As one example, in the present embodiment, if the observation value sampled at this timing is "1", an on-current exceeding the reference current is indicated, and it is anticipated that an overcurrent will be generated at the time of turn-off. If the observation value is "0", an on-current equal to or lower than the reference current is indicated, and it is anticipated that an overcurrent will not be generated at the time of turn-off. The hold circuit 713 supplies the changing unit 8 with the held observation value.

The hold circuit 713 may reset the held observation value after the completion of turn-off of the semiconductor element 12. As one example, the hold circuit 713 may reset it upon the element voltage of the semiconductor element 12 being the DC voltage Ed, may reset it upon the elapse of a required length of time from the start of supply of an off-signal to the semiconductor element 12 until completion of turn-off, or may reset it upon an on-signal being supplied to the semiconductor element 11. However, if the hold circuit 713 updates the held observation value every time sampling is performed, it may not be reset.

The changing unit 8 changes a driving condition applied to driving of the gate by the gate driving unit 6 when the semiconductor element 12 is turned off, according to an observation value sampled in an on-period of the semiconductor element 12, as one example, in the present embodiment, an observation value held by the hold circuit 713. The changing unit 8 has a logical AND circuit 80, a timer circuit 81, an off-condition changing circuit 82 and a timeout detecting unit 83.

The logical AND circuit 80 performs a logical AND operation on the observation value supplied from the hold circuit 713 and the off-signal supplied from the gate driving unit 6 to the gate of the semiconductor element 12. Thereby, the logical AND circuit 80 outputs a signal to become "1" in a period during which the observation value from the hold circuit 713 becomes "1" in a period during which an off-signal is supplied to the semiconductor element 12. The logical AND circuit 80 supplies the timer circuit 81 with a signal indicating a result of the operation.

The timer circuit 81 supplies the off-condition changing circuit 82 with timing to change a driving condition. For example, the timer circuit 81 supplies the off-condition changing circuit 82 with a signal of "1" instructing a change upon or after the elapse of reference switching time after a signal of "1" is supplied from the logical AND circuit 80. The timer circuit 81 supplies the off-condition changing circuit 82 with a signal of "0" not instructing a change if it is not being supplied with a signal of "1" from the logical AND circuit 80, for example if an observation value supplied from the hold circuit 713 is "0" and it is anticipated that an overcurrent will not be generated at the time of turn-off. The end timing of the reference switching time, that is, the driving condition change timing, may be the end timing, or timing therearound, of a mirror period in a turn-off period of the semiconductor element 12, for example.

The timer circuit 81 may be reset after completion of turn-off of the semiconductor element 12. As one example, the timer circuit 81 may be reset upon the hold circuit 713 being reset, and set an output signal to "0".

The off-condition changing circuit 82 switches a driving condition applied when the semiconductor element 12 is turned off between a first driving condition and a second driving condition according to a signal from the timer circuit 81. For example, the off-condition changing circuit 82 may change a driving condition applied to turn-off from the first driving condition to the second driving condition upon a signal of "1" being supplied from the timer circuit 81. Thereby, if an observation value sampled at the sampling circuit 71 is "1" and it is indicated that an on-current exceeds the reference current, a driving condition is switched from the first driving condition to the second driving condition during a turn-off period of the semiconductor element 12. In addition, if a sampled observation value is "0" and it is indicated that an on-current is equal to or lower than the reference current, a driving condition for the gate driving unit 6 is maintained at the first driving condition in a turn-off period of the semiconductor element 12.

Here, under the second driving condition, a charge amount of the gate of the semiconductor element 12 is changed gradually compared to under the first driving condition. Under the second driving condition, the off-condition changing circuit 82 corrects and supplies a gate signal at the time of turn-off so that the speed of charge injection to the gate of the semiconductor element 12 is lowered as compared to under the first driving condition. For example, the off-condition changing circuit 82 may lower gate current at the time of turn-off, may lower gate voltage at the time of turn-off or may stop supply of gate current at the time of turn-off. To lower the gate current at the time of turn-off, for example, the internal path through which the gate current flows may be switched from a path in which the resistance value is low to a path in which the resistance value is high. To lower the gate voltage at the time of turn-off, for example, the power-supply voltage of a gate driving circuit may be switched to a voltage value lower than a normal value. Alternatively, the value of power-supply voltage (not illustrated in figures) to be supplied to the driving apparatus 5 may be switched to a low voltage value. Voltage and current of a turn-off signal here refer to, but are not limited to, gate voltage and gate current, respectively.

The timeout detecting unit 83 detects whether or not an on-period of the semiconductor element 12 has exceeded predetermined third reference time. In addition, regardless of a signal supplied from the timer circuit 81, if the on-period of the semiconductor element 12 has exceeded the third reference time, the timeout detecting unit 83 causes the off-condition changing circuit 82 to change a driving condition to the second driving condition during a turn-off period of the semiconductor element 12. Thereby, the driving condition applied in the turn-off period of the semiconductor element 12 is switched from the first driving condition to the second driving condition regardless of the magnitude of an observation value. The third reference time may be time long enough such that it is anticipated that an overcurrent will be generated in a turn-off period, and as one example, may be time longer than a switching cycle predetermined for the semiconductor device 1. In addition, the third reference time may be time in which an on-current at the time of turn-on is estimated to change to be equal to or larger than a tolerated value until the time of turn-off. The timing for the timeout detecting unit 83 to switch a driving condition may be timing at which the above-mentioned reference switching time has elapsed after an off-signal is supplied from the gate driving unit 6. Although in the present embodiment, the on-period is defined as a period starting at the start of supply of a turn-on signal of the semiconductor element 12 or the start of a change in gate voltage of the semiconductor element 12 and terminating at the end of supply of a turn-on signal from the gate driving unit 6 to the semiconductor element 12 or the start of supply of a turn-off signal, definitions of both the time of start and the time of end of an on-period are not limited to them.

According to the above-mentioned semiconductor device 1, a driving condition applied to the gate at the time of turn-off is changed according to an observation value sampled in an on-period, as one example, an observation value sampled and held in an on-period. Accordingly, the driving condition can be changed according to a breaking current at the time of turn-off predicted from the observation value sampled in an on-period. Therefore, unlike the case where an observation value is measured in a turn-off period and a driving condition is changed, the driving condition can be surely changed in a turn-off period even if the on-off switching speed is high. Accordingly, it is possible to prevent the surge voltage due to turn-off from becoming an overvoltage. In addition, a turn-off period can be shortened and turn-off loss can be reduced compared to the case where turn-off is performed using only a driving condition under which a gate charge amount is changed gradually and without changing the driving condition.

In addition, because the driving condition is changed to one under which a gate charge amount is changed gradually if an observation value indicates that there is an on-current exceeding the reference current, it is possible to surely prevent the surge voltage generated due to turn-off from becoming an overvoltage.

In addition, because a value obtained by subtracting a predetermined margin from an overcurrent level at which an overvoltage is generated is used as the reference current, it is possible to more surely prevent an overvoltage due to turn-off.

In addition, if an on-period of the semiconductor element 12 has exceeded the third reference time, the driving condition applied to the gate is switched to the second driving condition during a turn-off period of the semiconductor element 12 regardless of the magnitude of an observation value. Accordingly, it is possible to surely prevent an overvoltage if it is likely that the surge voltage due to turn-off becomes an overvoltage because of a long on-period.

Figure 2:
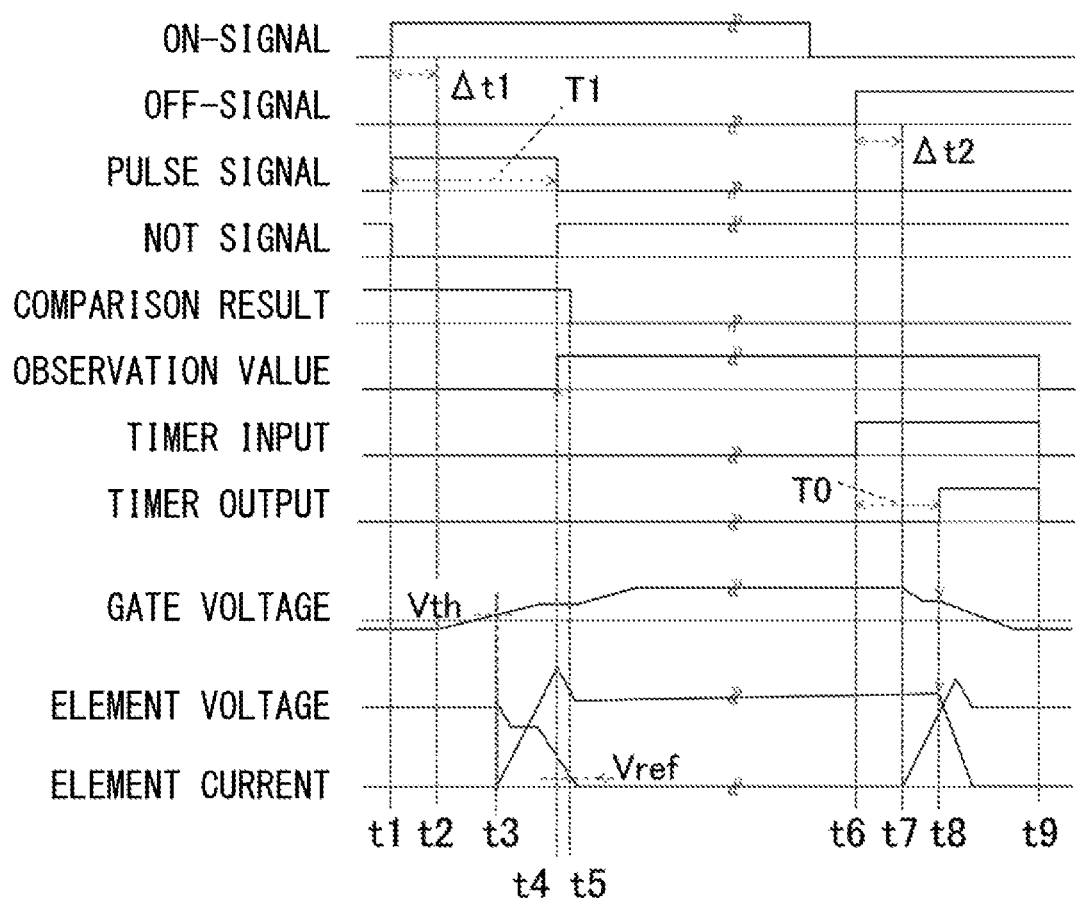
FIG. 2 shows one example of operation waveforms of the semiconductor device according to the embodiment.

FIG. 2 shows one example of operation waveforms of the semiconductor device 1. Based on operation waveforms of FIG. 2, the semiconductor device 1 changes a driving condition applied at the time of turn-off by predicting an overvoltage of the surge voltage occurring at the time of turn-off of the semiconductor element 12.

First, an on-signal to be high at and after the time point t1 is output from the gate driving unit 6 (please see the waveform of the on-signal). The on-signal is supplied to the gate of the semiconductor element 12, the pulse generating circuit 710 and the logical AND circuit 712.

When the on-signal is supplied, the pulse generating circuit 710 supplies the logical NOT circuit 711 with a pulse signal having the length of first reference time T1 (please see the waveform of the pulse signal). Thereby, the logical NOT circuit 711 outputs a signal that becomes "0" for the first reference time T1 (please see the waveform of the NOT signal). In this example, the end timing of the first reference time T1 is assumed to be the time point t4.

In addition, in response to supply of the on-signal, the gate voltage of the semiconductor element 12 rises at and after the time point t2 which is delay time Δt1 after the time point t1 and exceeds the gate threshold value Vth (5 v, as one example) at the time point t3, and the semiconductor element 11 starts being turned on (please see the waveform of the gate voltage). Thereby, the element voltage lowers, and the element current increases (please see the waveforms of the element voltage and element current). Because in this operation example, the element voltage becomes lower than the reference voltage Vref at the time point t5 which is later than the end timing of the first reference time T1, a value output by the comparator circuit 70 is "1" until the time point t5 and becomes "0" at the time point t5 (please see the waveform of a comparison result).

Next, at the time point t4 at which the first reference time T1 elapses, an output from the pulse generating circuit 710 becomes "0", and an output from the logical NOT circuit 711 becomes "1" (please see the waveforms of the pulse signal and NOT signal). Thereby, an output from the logical AND circuit 712 becomes "1" at the time point t4, and a value "1" output by the comparator circuit 70 at this time point t4 is sampled and held as an observation value by the hold circuit 713 (please see the waveform of the observation value). The hold circuit 713 supplies the logical AND circuit 80 with the held observation value "1".

Next, after the output of the on-signal from the gate driving unit 6 ends, an off-signal to be high at and after the time point t6 is output (please see the waveforms of the on-signal and off-signal). The off-signal is supplied to the logical AND circuit 80 and off-condition changing circuit 82.

When the off-signal is supplied, at and after the time point t7 which is delay time Δt2 after the time point t6, the gate voltage of the semiconductor element 12 lowers, and the element voltage rises (please see the waveforms of the gate voltage and element voltage).

In addition, because when the off-signal is supplied, the observation value "1" is being supplied from the hold circuit 713 to the logical AND circuit 80, a signal of "1" is input to a timer circuit as a result of a logical AND operation (please see the waveform of the timer input). Thereby, the timer circuit supplies the off-condition changing circuit 82 with a signal of "1" instructing to change a driving condition at or after the time point t8 at which the reference switching time T0 elapses after the time point t6 (please see the waveform of the timer output). Then, as a result of switching by the off-condition changing circuit 82 of a driving condition for the semiconductor element 12 at and after the time point t8 to the second driving condition, change in the gate charge amount of the semiconductor element 12 becomes gradual one, and the surge voltage accompanying turn-off is suppressed.

In this operation example, the hold circuit 713 and timer circuit 81 are reset at the time point t9 after turn-off of the semiconductor element 12 is completed (please see the waveforms of the observation value and timer output).

Figure 3:
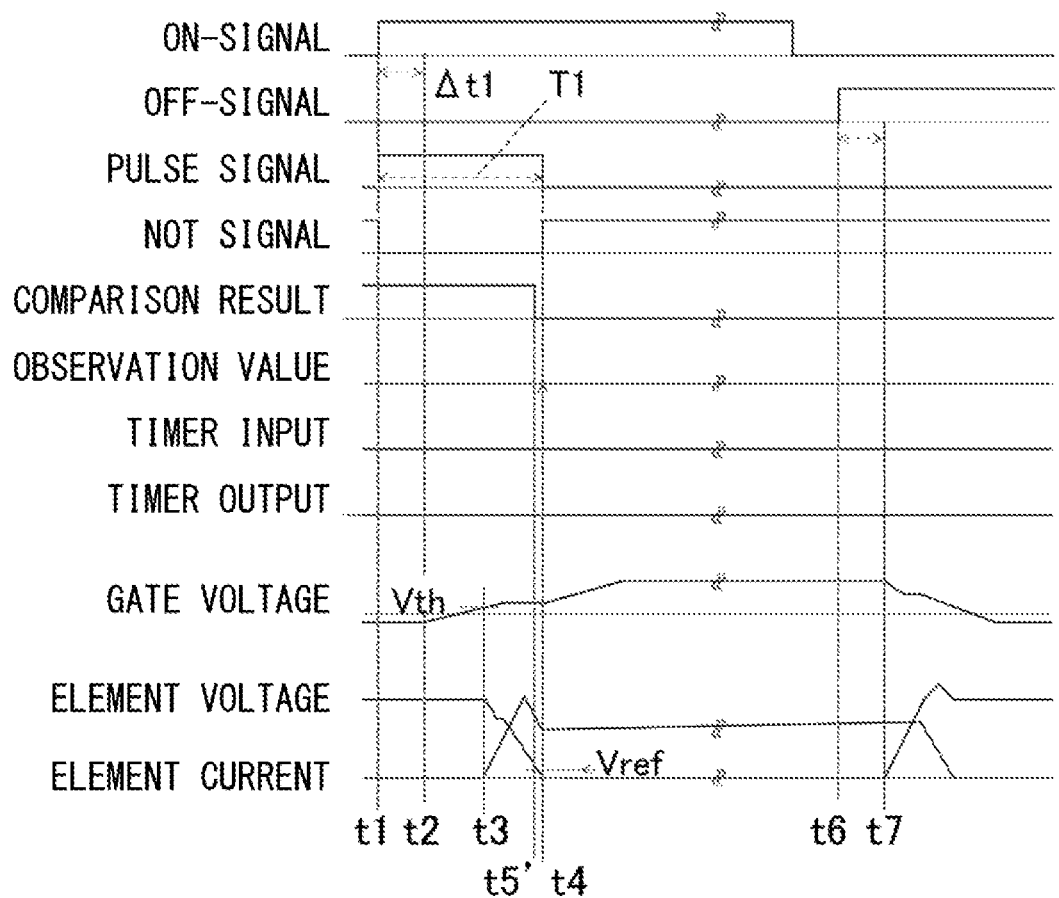
FIG. 3 shows another example of operation waveforms of the semiconductor device according to the embodiment.

FIG. 3 shows another example of operation waveforms of the semiconductor device 1. The semiconductor device 1 performs turn-off without changing a driving condition if an overvoltage due to the surge voltage is not predicted at the time of turn-off as shown in the operation waveforms in FIG. 3. Because the operation at and after the time point t1 and before and at the time point t3 is the same as that in FIG. 2, an explanation thereof is omitted.

In this operation example, the element voltage becomes lower than the reference voltage Vref at the time point t5' before the time point t4 which is the end timing of the first reference time T1 (please see the waveform of the element voltage). Because of this, the value output by the comparator circuit 70 is "1" until the time point t5' and becomes "0" at the time point t5' (please see the waveform of the comparison result).

Next, at the time point t4 at which the first reference time T1 elapses, an output from the pulse generating circuit 710 becomes "0", and an output from the logical NOT circuit 711 becomes "1" (please see the waveforms of the pulse signal and NOT signal). Thereby, an output from the logical AND circuit 712 becomes "1" at the time point t4, and a value "0" output by the comparator circuit 70 at this time point t4 is sampled and held as an observation value by the hold circuit 713 (please see the waveform of the observation value). The hold circuit 713 supplies the logical AND circuit 80 with the held observation value "0". Because of this, in this operation example, the driving condition change timing is not supplied from the timer circuit 81 to the off-condition changing circuit 82, and a change is not made in the driving condition at the time of turn-off.

Figure 4:
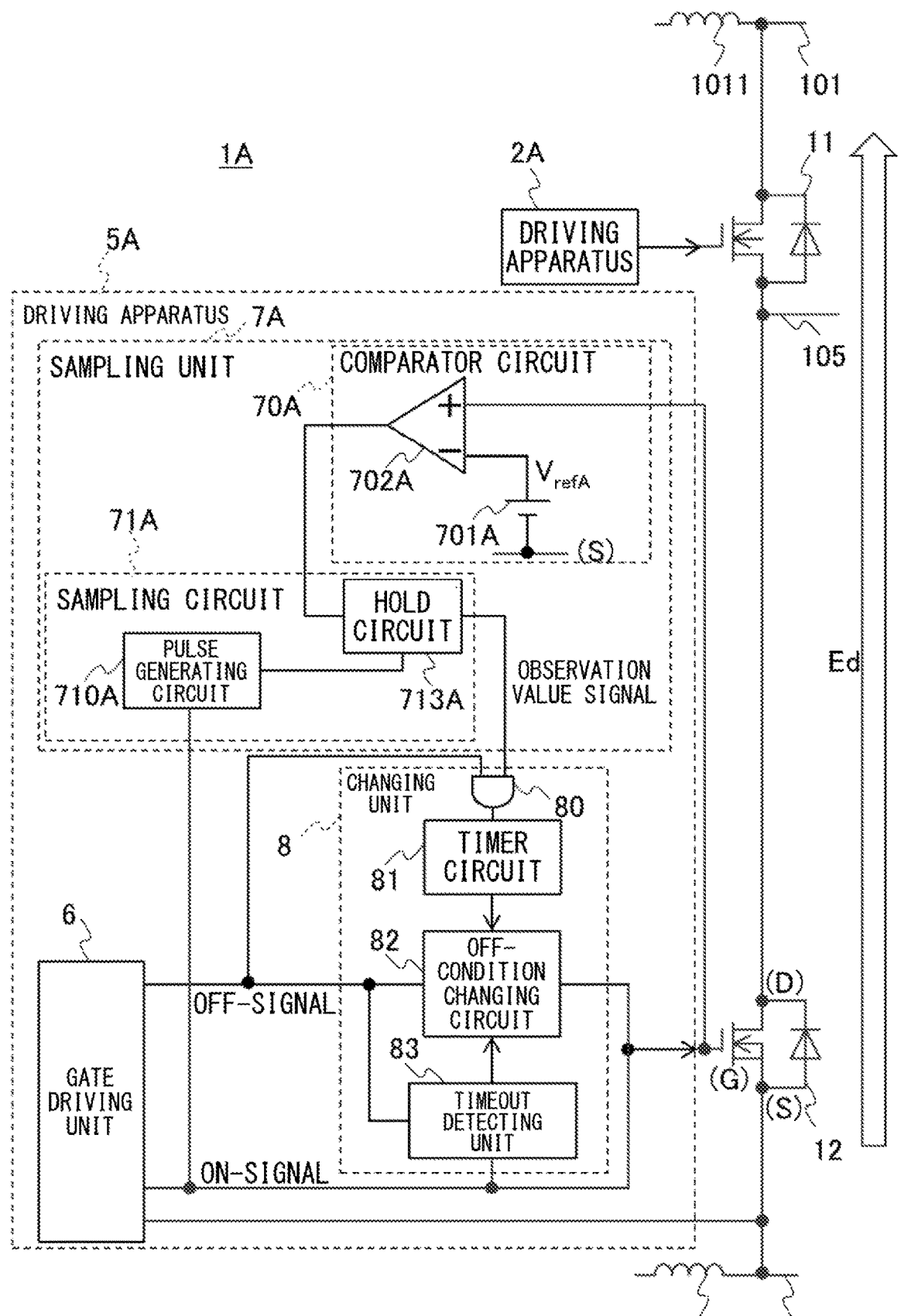
FIG. 4 shows a semiconductor device according to a variant of the embodiment.

FIG. 4 shows a semiconductor device 1A according to a variant of the present embodiment. At least one of driving apparatuses 2A, 5A in the semiconductor device 1A, both the driving apparatuses 2A, 5A in the present variant, changes or change a driving condition during the turn-off period using an observation value corresponding to the gate voltage or gate current. Because the configuration of the driving apparatus 2A on the positive side is the same as the driving apparatus 5A on the negative side, an explanation thereof is omitted.

The driving apparatus 5A has a comparator circuit 70A and a sampling circuit 71A. The comparator circuit 70A compares the gate voltage of the semiconductor element 12 with the reference voltage VrefA using a comparator 702A. The reference voltage VrefA corresponds to the reference current of an on-current of the semiconductor element 12, and is supplied to the comparator 702A by the reference voltage source 701A. The comparator circuit 70A may compare the gate current with the reference gate current, instead of comparing the gate voltage with the reference voltage VrefA.

The sampling circuit 71A has a pulse generating circuit 710A and a hold circuit 713A. The pulse generating circuit 710A supplies the hold circuit 713A with a pulse signal having the length of the second reference time from the start of a turn-on period of the semiconductor element 12. The hold circuit 713A samples an observation value at the falling timing of the pulse signal. Thereby, at the timing at which the second reference time has elapsed after the start of a turn-on period of the semiconductor element 12, an observation value corresponding to a gate voltage of the semiconductor element 12 is sampled.

As one example, the pulse generating circuit 710A supplies the hold circuit 713A with a signal that becomes "1" for the second reference time according to an on-signal being output from the gate driving unit 6, and becomes "0" before and after the second reference time. The end timing of the second reference time may be in a mirror period in a turn-on period of the semiconductor element 12. Thereby, an observation value corresponding to the mirror voltage at the time of turn-on of the semiconductor element 12 is sampled by the hold circuit 713A.

Because according to the above-mentioned semiconductor device 1A, an observation value corresponding to the gate voltage is sampled, it is not necessary to make the withstand voltage of the comparator circuit high, unlike the case where an observation value corresponding to an element voltage or element current is sampled. Accordingly the configuration of the comparator circuit can be simplified.

In addition, an observation value corresponding to a gate voltage is sampled in a mirror period in which the gate voltage becomes constant, setting of the sampling timing can be made easy to perform.

Figure 5:
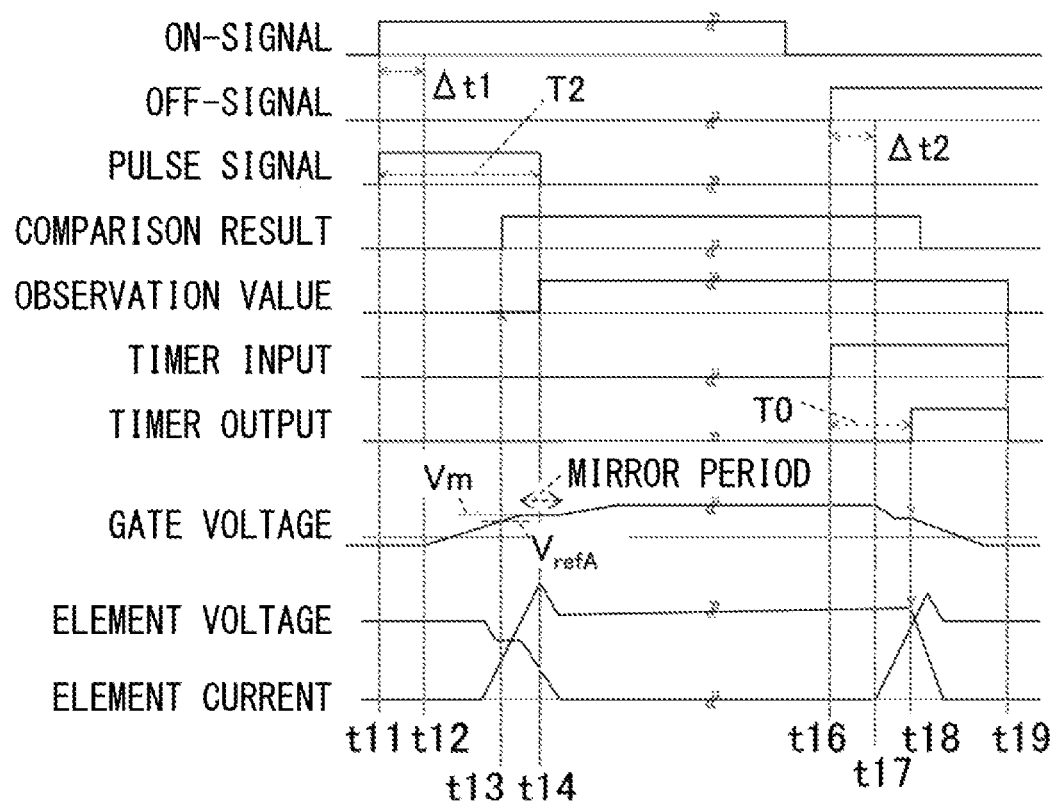
FIG. 5 shows one example of operation waveforms of the semiconductor device according to the variant.

FIG. 5 shows one example of operation waveforms of the semiconductor device 1A. Based on operation waveforms of FIG. 5, the semiconductor device 1A changes a driving condition applied at the time of turn-off by predicting an overvoltage of the surge voltage occurring at the time of turn-off of the semiconductor element 12.

First, an on-signal to be high at and after the time point t11 is output from the gate driving unit 6 (please see the waveform of the on-signal). The on-signal is supplied to the gate of the semiconductor element 12 and the pulse generating circuit 710A.

When the on-signal is supplied, the gate voltage of the semiconductor element 12 rises at and after the time point t12 which is delay time Δt1 after the time point t1 and exceeds the gate threshold value (not illustrated in the figure), and the semiconductor element 11 starts being turned on (please see the waveform of the gate voltage). Then, because the gate voltage exceeds the reference voltage VrefA at the time point t13, a value output by the comparator circuit 70A is "0" until the time point t13, and becomes "1" at the time point t13 (please see the waveform of the comparison result).

In addition, in response to supply of the on-signal, the pulse generating circuit 710A supplies the hold circuit 713A with a pulse signal having the length of second reference time T2 (please see the waveform of the pulse signal). In this example, the end timing of the second reference time T2 is at the time point t14 in the mirror period during which the gate voltage is maintained at the mirror voltage Vm, and the time point t14 is later than the time point t13. Because of this, the value "1" output by the comparator circuit 70 is sampled and held as an observation value by the hold circuit 713A at the time point t14 (please see the waveform of the comparison result and observation value). The hold circuit 713A supplies the logical AND circuit 80 with the held observation value "1".

Next, after the output of the on-signal from the gate driving unit 6 ends, an off-signal to be high at and after the time point t16 is output (please see the waveforms of the on-signal and off-signal). The off-signal is supplied to the logical AND circuit 80 and off-condition changing circuit 82.

When the off-signal is supplied, at and after the time point t17 which is delay time Δt2 after the time point t16, the gate voltage of the semiconductor element 12 lowers, and the element voltage rises (please see the waveforms of the gate voltage and element voltage).

In addition, because when the off-signal is supplied, the observation value "1" is supplied from the hold circuit 713A to the logical AND circuit 80, a signal of "1" is input to a timer circuit as a result of a logical AND operation, (please see the waveform of the timer input). Thereby, the timer circuit supplies the off-condition changing circuit 82 with a signal of "1" instructing to change a driving condition at or after the time point t18 at which the reference switching time T0 elapses after the time point t16 (please see the waveform of the timer output). Then, as a result of switching by the off-condition changing circuit 82 of a driving condition for the semiconductor element 12 at and after the time point t18 to the second driving condition, change in the gate charge amount of the semiconductor element 12 becomes gradual one, and the surge voltage accompanying turn-off is suppressed.

In this operation example, the hold circuit 713A and timer circuit 81 are reset at the time point t19 after turn-off of the semiconductor element 12 is completed (please see the waveforms of the observation value and timer output).

Figure 6:
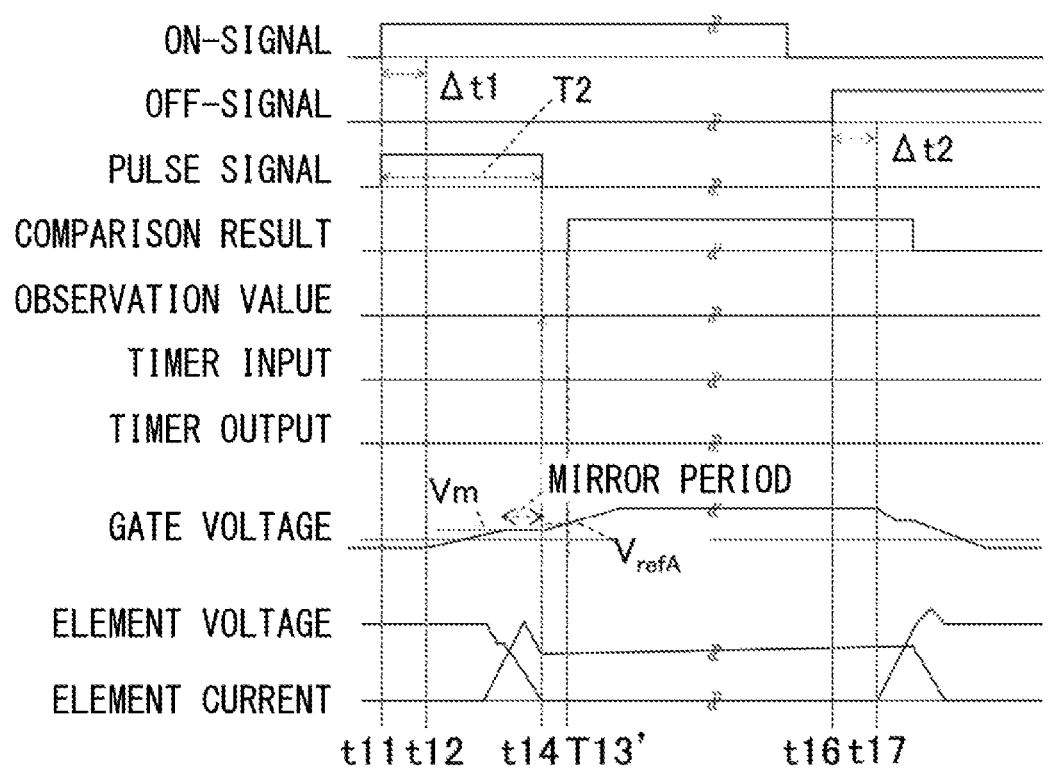
FIG. 6 shows another example of operation waveforms of the semiconductor device according to the variant.

FIG. 6 shows another example of operation waveforms of the semiconductor device 1A. The semiconductor device 1A performs turn-off without changing a driving condition if an overvoltage due to the surge voltage is not predicted at the time of turn-off as shown in the operation waveforms in FIG. 6. Because the operation at and after the time point t11 and before and at the time point t13 is the same as that in FIG. 5, an explanation thereof is omitted.

In this operation example, at the time point t13' later than the time point t14, the gate voltage exceeds the reference voltage Vref (please see the waveform of the gate voltage), and a value output by the comparator circuit 70A becomes "1" (please see the waveform of the comparison result). Because of this, when the second reference time T2 elapses at the time point t14 and an output from the pulse generating circuit 710 becomes "0" (please see the waveform of the pulse signal), a value "0" output by the comparator circuit 70A is sampled and held as an observation value by the hold circuit 713A (please see the waveform of the observation value). Therefore, because the observation value "0" is supplied to the logical AND circuit 80, and driving condition change timing is not supplied from the timer circuit 81 to the off-condition changing circuit 82, a change is not made to a driving condition at the time of turn-off.

In the above-mentioned embodiment and variant explained, a result of comparison by the comparator circuit 70 is sampled and held by the hold circuit 713 according to a signal supplied to a trigger terminal. However, the semiconductor devices 1, 1A may perform sampling and holding using another configuration. For example, the semiconductor device 1 may perform a logical AND operation on a signal output by the comparator circuit 70, a signal output by the logical NOT circuit 711 and an on-signal from the gate driving unit 6 and hold a result of the operation. Likewise, the semiconductor device 1A may perform a logical AND operation on a signal output by the comparator circuit 70A, an inverted signal output by the pulse generating circuit 710A and an on-signal from the gate driving unit 6, and hold a result of the operation.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. A driving apparatus comprising:
    a gate driving unit that drives a semiconductor element;
    a sampling unit that samples, in an on-period of the semiconductor element, an observation value that changes according to an on-current flowing through the semiconductor element;
    a changing unit that changes a driving condition under which the gate driving unit drives a gate of the semiconductor element when the semiconductor element is turned off according to the observation value sampled in an on-period of the semiconductor element; and
    a timeout detecting unit that detects whether or not an on-period of the semiconductor element has exceeded a predetermined reference time, wherein
    if an on-period of the semiconductor element has exceeded the predetermined reference time, the changing unit switches a driving condition for the gate driving unit from a first driving condition to a second driving condition during a turn-off period of the semiconductor element irrespective of a magnitude of the observation value.

2. The driving apparatus according to claim 1, wherein the sampling unit holds the sampled observation value, and
    the changing unit changes a driving condition under which the gate driving unit drives the gate when the semiconductor element is turned off according to the held observation value.

3. The driving apparatus according to claim 1, wherein the sampling unit samples the observation value in a turn-on period of the semiconductor element.

4. The driving apparatus according to claim 3, wherein the sampling unit samples the observation value corresponding to a length of time starting at a start of a turn-on period of the semiconductor element and terminating when an element voltage of the semiconductor element becomes a reference voltage.

5. The driving apparatus according to claim 3, wherein the sampling unit has:
    a comparator circuit that compares an element voltage of the semiconductor element with a reference voltage; and
    a sampling circuit that samples the observation value corresponding to a result of comparison by the comparator circuit at timing at which first reference time has elapsed after a start of a turn-on period of the semiconductor element.

6. The driving apparatus according to claim 3, wherein the sampling unit samples the observation value corresponding to a gate voltage or gate current of the semiconductor element at timing at which second reference time has elapsed after a turn-on period of the semiconductor element has started.

7. The driving apparatus according to claim 6, wherein the sampling unit samples the observation value corresponding to a gate voltage or gate current of the semiconductor element in a mirror period in a turn-on period of the semiconductor element.

8. The driving apparatus according to claim 1, wherein the changing unit can switch to a first driving condition and a second driving condition under which a charge amount of a gate of the semiconductor element is changed gradually as compared to the first driving condition,
    if the observation value sampled in an on-period of the semiconductor element indicates an on-current equal to or lower than a reference current, a driving condition for the gate driving unit is maintained at the first driving condition in a turn-off period of the semiconductor element, and
    if the observation value sampled in an on-period of the semiconductor element indicates an on-current exceeding a reference current, a driving condition for the gate driving unit is switched from the first driving condition to the second driving condition during a turn-off period of the semiconductor element.

9. The driving apparatus according to claim 1, wherein the semiconductor element is a wide-bandgap semiconductor element.

10. A semiconductor device comprising:
    the driving apparatus according to claim 1; and
    the semiconductor element.

11. A driving apparatus comprising:
    a gate driving unit that drives a semiconductor element;
    a sampling unit that samples, in an on-period of the semiconductor element, an observation value that changes according to an on-current flowing through the semiconductor element; and
    a changing unit that changes a driving condition under which the gate driving unit drives a gate of the semiconductor element when the semiconductor element is turned off according to the observation value sampled in an on-period of the semiconductor element, wherein
    the changing unit can switch to a first driving condition and a second driving condition under which a charge amount of a gate of the semiconductor element is changed gradually as compared to the first driving condition,
    if the observation value sampled in an on-period of the semiconductor element indicates an on-current equal to or lower than a reference current, a driving condition for the gate driving unit is maintained at the first driving condition in a turn-off period of the semiconductor element, and
    if the observation value sampled in an on-period of the semiconductor element indicates an on-current exceeding a reference current, a driving condition for the gate driving unit is switched from the first driving condition to the second driving condition during a turn-off period of the semiconductor element, the driving apparatus further comprises:

a timeout detecting unit that detects whether or not an on-period of the semiconductor element has exceeded predetermined third reference time, wherein if an on-period of the semiconductor element has exceeded the third reference time, the changing unit switches a driving condition for the gate driving unit from the first driving condition to the second driving condition during a turn-off period of the semiconductor element irrespective of a magnitude of the observation value.

* * * * *